(12) United States Patent
Yamamoto

(10) Patent No.: US 7,312,672 B2
(45) Date of Patent: Dec. 25, 2007

(54) LOCAL OSCILLATING CIRCUIT FOR RECEIVING HIGH-BAND AND LOW-BAND SIGNAL

(75) Inventor: Masaki Yamamoto, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 110 days.

(21) Appl. No.: 11/204,118

(22) Filed: Aug. 15, 2005

(65) Prior Publication Data

US 2006/0038629 A1    Feb. 23, 2006

(30) Foreign Application Priority Data

Aug. 20, 2004   (JP)   .............................. 2004-240989

(51) Int. Cl.
*H03B 1/00*   (2006.01)

(52) U.S. Cl. .............................. 331/177 V; 331/117 R; 331/167; 361/91.5; 455/188.1; 455/188.2; 455/191.2

(58) Field of Classification Search ............ 331/177 V, 331/167, 117 R; 455/191.2, 188.1, 188.2; 361/91.5

See application file for complete search history.

(56) References Cited

FOREIGN PATENT DOCUMENTS

JP   2003-179430   6/2003
JP      3105078    8/2004

*Primary Examiner*—Arnold Kinkead
(74) *Attorney, Agent, or Firm*—Brinks Hofer Gilson & Lione

(57) ABSTRACT

A local oscillating circuit includes an integrated circuit that has an oscillating transistor, protection diodes against electrostatic damage, and first and second terminals each being connected to a base and a collector of the oscillating transistor, cathodes of the protection diodes being respectively connected to the first and second terminals and anodes thereof being connected to a ground; and a resonating circuit that is provided outside the integrated circuit and is connected between the first and second terminals. A reverse-biasing voltage is applied to each of the cathodes of the protection diodes when VHF high-band signals are received while a voltage is not applied to each of the cathodes when VHF low-band signals are received.

4 Claims, 1 Drawing Sheet

LOCAL OSCILLATING CIRCUIT FOR RECEIVING HIGH-BAND AND LOW-BAND SIGNAL

This application claims the benefit of priority to Japanese Patent Application No. 2004-240989 filed on Aug. 20, 2004, herein incorporated by reference.

BACKGROUND OF THE INVENTION

1. Field of the Invention

The present invention relates to a local oscillating circuit suitable for a television tuner.

2. Description of the Related Art

Referring to FIG. 2, a conventional local oscillating circuit used in a television tuner will be described. First, an integrated circuit 60 includes a pair of oscillating transistors 61 and 62 whose emitters are connected to each other, and a constant current source 63. Also, a voltage is applied to each of the collectors of the pair of oscillating transistors 61 and 62 through a power-feeding resistor. Further, the integrated circuit 60 includes first to fourth coupling capacitors 64 to 67.

The integrated circuit 60 is provided with a first terminal 60a and a second terminal 60b. To the first terminal 60a, a base of the first oscillating transistor 61 is connected through the first coupling capacitor 64 and the collector of the second oscillating transistor 62 is connected through the second coupling capacitor 65. Also, to the second terminal 60b, the collector of the first oscillating transistor 61 is connected through the third coupling capacitor 66 and a base of the second oscillating transistor 62 is connected through the fourth coupling capacitor 67. In addition, the integrated circuit 60 includes a diode 68 whose cathode is connected to the first terminal 60a and anode is connected to a ground, and a diode 69 whose cathode is connected to the second terminal 60b and anode is connected to a ground.

Further, the integrated circuit 60 includes a pair of oscillating transistors 71 and 72 whose emitters are connected to each other, and a constant current source 73. Also, a voltage is applied to each of collectors of the pair of oscillating transistors 71 and 72 through a power-feeding resistor. Further, the integrated circuit 60 includes a fifth coupling capacitor 74 connected to a base of the third oscillating transistor 71, a sixth coupling capacitor 75 connected to the collector of the fourth oscillating transistor 72, and a capacitor 76 for connecting a base of the fourth oscillating transistor 72 to a ground.

Furthermore, the integrated circuit 60 is provided with a third terminal 60c, the fifth coupling capacitor 74 is connected between the third terminal 60c and the base of the third oscillating transistor 71, and the sixth coupling capacitor 75 is connected between the third terminal 60c and the collector of the fourth oscillating transistor 72. In addition, the integrated circuit 60 includes a diode 77 whose cathode is connected to the third terminal 60c and anode is connected to a ground. The above-mentioned three diodes 68, 69, and 77 serve as protection diodes against electrostatic damage.

Outside the integrated circuit 60 are provided a first resonating circuit 81 and a second resonating circuit 82. The first resonating circuit 81 is a parallel resonating circuit composed of an inductance element 81a and a varactor diode 81b and is connected between the first terminal 60a and the second terminal 60b. An anode of the varactor diode 81b is DC connected to a ground through a resistor 81c, and a tuning voltage Vt is applied to a cathode of the varactor diode 81b. Such a local oscillating circuit is used as a balanced local oscillator for receiving high-band television signals within a VHF band.

In addition, the second resonating circuit 82 is a parallel resonating circuit composed of an inductance element 82a and a varactor diode 82b, and one end of the second resonating circuit 82 is connected to the third terminal 60c and the other end thereof is connected to a ground. Also, an anode of the varactor diode 82b is DC connected to a ground through the inductance element 82a, and the tuning voltage Vt is applied to a cathode thereof. Such a local oscillating circuit is used as a non-balanced local oscillator for receiving low-band television signals (for example, see Japanese Unexamined Patent Application Publication No. 2003-179430 (FIG. 3)).

However, since a local oscillating circuit for receiving high-band signals and a local oscillating circuit for receiving low-band signals are provided independently in the configuration described above, the configuration is complex although a sufficient oscillating frequency band can be obtained in each receiving band.

SUMMARY OF THE INVENTION

The present invention is designed to solve the above-mentioned problems, and it is an object of the invention to cover both a local oscillating frequency band for receiving high-band signals and a local oscillating frequency band for receiving low-band signals by using a common oscillating transistor and a common resonating circuit.

In order to achieve the above object, according to an aspect of the invention, a local oscillating circuit includes: an integrated circuit that has an oscillating transistor, protection diodes against electrostatic damage, and first and second terminals each being connected to a base and a collector of the oscillating transistor, cathodes of the protection diodes being respectively connected to the first and second terminals and anodes thereof being connected to a ground; and a resonating circuit that is provided outside the integrated circuit and is connected between the first and second terminals. A reverse-biasing voltage is applied to each of the cathodes of the protection diodes when VHF high-band signals are received while a voltage is not applied to each of the cathodes when VHF low-band signals are received.

Further, the local oscillating circuit according to the invention, preferably, one end of the resonating circuit is connected to the first terminal through a coupling varactor diode and the other end thereof is connected to the second terminal. Also, preferably, an anode of the varactor diode is DC connected to a ground, and a reverse-biasing voltage is applied to a cathode of the varactor diode when VHF high-band signals are received while a voltage is not applied to the cathode thereof when VHF low-band signals are received.

Furthermore, in the local oscillating circuit according to the invention, preferably, the integrated circuit further includes a first resistor whose one end is connected to the second terminal and that is serially inserted in the resonating circuit; a switching transistor whose collector is connected to the other end of the first resistor and emitter is connected to a ground; and a second resistor connected between the collector of the switching transistor and the first terminal. Also, preferably, a power supply voltage is applied to the collector of the switching transistor through a power-feeding resistor, and the switching transistor is turned off when the high-band signals are received and is turned on when the low-band signals are received.

In addition, in the local oscillating circuit according to the invention, preferably, the oscillating transistor has first and second oscillating transistors. Also, preferably, a base of the first oscillating transistor and a collector of the second oscillating transistor are connected to the first terminal through a first coupling capacitor and a second coupling capacitor, respectively, and a collector of the first oscillating transistor and a base of the second oscillating transistor are connected to the other end of the first resistor through a third coupling capacitor and a fourth coupling capacitor, respectively.

DESCRIPTION OF THE PREFERRED EMBODIMENT

Figure 1:
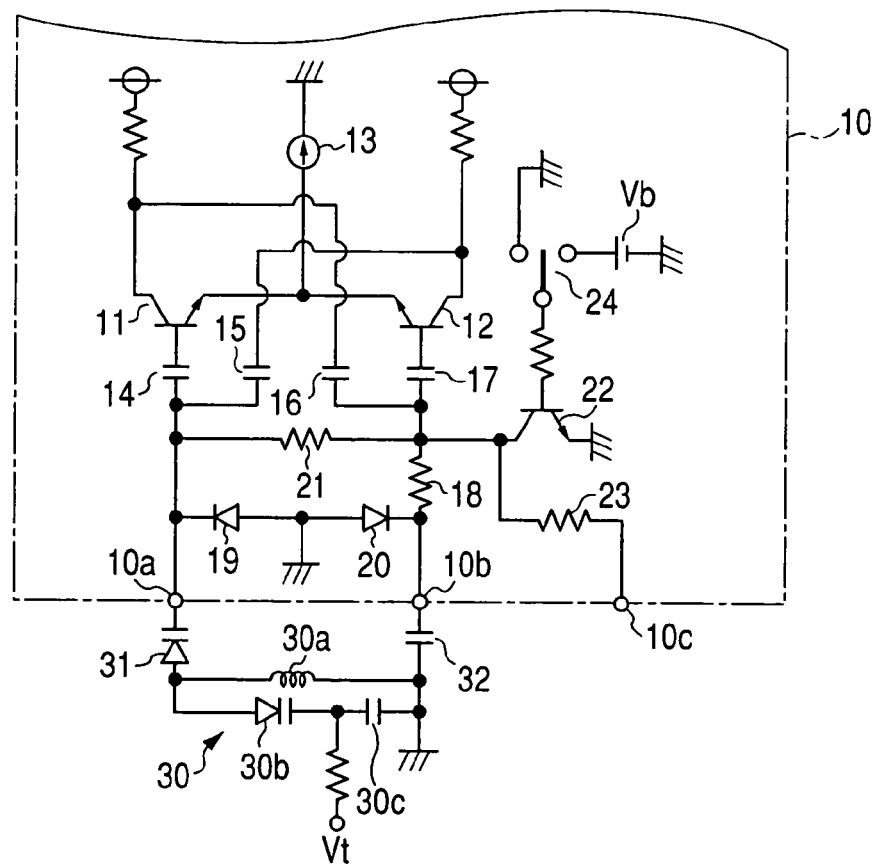
FIG. 1 is a circuit diagram illustrating the configuration of a local oscillating circuit according to the invention.
Figure 2:
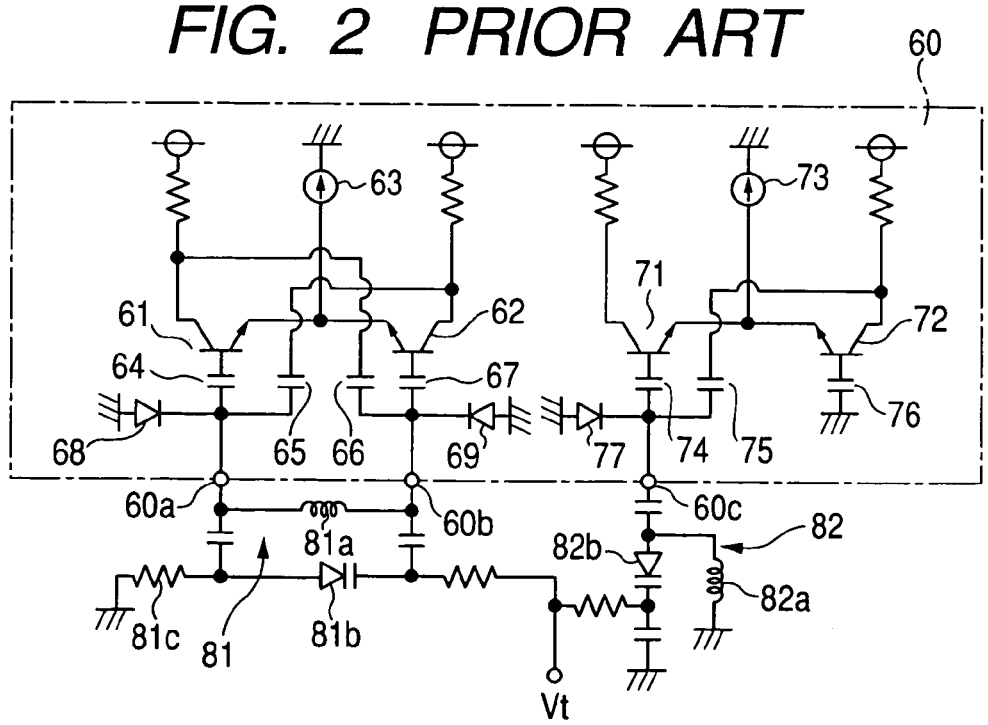
FIG. 2 is a circuit diagram illustrating the configuration of a conventional local oscillating circuit.

Hereinafter, a local oscillating circuit of the invention will be described with reference to FIG. 1. The local oscillating circuit of the invention includes, for example, oscillating transistors 11 and 12 and peripheral circuits provided in an integrated circuit 10, and a resonating circuit 30 provided outside the integrated circuit 10.

In the integrated circuit 10, emitters of the first and second oscillating transistors 11 and 12 are connected to each other and are also connected to a constant current source 13. Further, a voltage is applied to each of collectors of the first and second oscillating transistors 11 and 12 through a power-feeding resistor. In addition, the integrated circuit 10 includes first to fourth coupling capacitors 14 to 17. Also, the integrated circuit 10 is provided with first and second terminals 10a and 10b for connecting the resonating circuit 30 thereto, and a third terminal 10c for power feeding.

To the first terminal 10a, a base of the first oscillating transistor 11 is connected through the first coupling capacitor 14 and the collector of the second oscillating transistor 12 is connected through the second coupling capacitor 15. Further, to the second terminal 10b is connected one end of a first resistor 18 for Q damping, the first resistor 18 having a resistance of about 50 Ω, and to the other end of the first resistor 18, the collector of the first oscillating transistor 11 is connected through the third coupling capacitor 16 and a base of the second oscillating transistor 12 is connected through the fourth coupling capacitor 17.

In addition, a cathode of a first protection diode 19 against electrostatic damage is connected to the first terminal 10a, and a cathode of a second protection diode 20 is connected to the second terminal 10b. Anodes of the protection diodes 19 and 20 are connected to a ground. Moreover, between the other end of the first resistor 18 and the first terminal 10a is connected a second resistor 21 for power feeding, the second resistor 21 having a resistance of several tens of kilo-ohms.

Further, the integrated circuit 10 includes a switching transistor 22 whose emitter is connected to a ground and collector is connected to a connection point between the first resistor 18 and the second resistor 21. The collector of the switching transistor 22 is connected to the third terminal 10c through a third resistor 23 for power feeding, the third resistor 23 having a resistance of several tens of kilo-ohms. A low voltage (grounded voltage) or a high voltage (for example, power supply voltage Vb) is applied to a base of the switching transistor 22 by a switching unit 24.

The resonating circuit 30 is a parallel resonating circuit composed of an inductance element 30a and a varactor diode 30b. An anode of the varactor diode 30b is connected to one end of the inductance element 30a, and a cathode of the varactor diode 30b is connected to the other end of the inductance element 30a through a capacitor 30c to be grounded. Also, one end (at an anode side of the varactor diode 30b) of the resonating circuit 30 is connected to the first terminal 10a through a coupling varactor diode 31. In this case, the anode of the varactor diode 31 is connected to the one end of the resonating circuit 30 and the cathode thereof is connected to the first terminal 10a.

Further, the other end of the resonating circuit 30 is connected to the second terminal 10b through a DC-blocking capacitor 32. A connection point between the resonating circuit 30 and the DC-blocking capacitor 32 is connected to a ground. Accordingly, the anodes of the two varactor diodes 30b and 31 are DC connected to a ground through the inductance element 30a. In addition, a tuning voltage Vt for converting a resonating frequency (consequently, an oscillating frequency) of the resonating circuit 30 is applied to the cathode of the varactor diode 30b. The second terminal 10b is AC connected to a ground through the DC-blocking capacitor 32.

With the configuration described above, the resonating circuit 30 is coupled between the base and the collector of the first oscillating transistor 11 through the coupling capacitors 14 and 16 and is also coupled between the base and the collector of the second oscillating transistor 12 through the coupling capacitors 17 and 15. As such, the two oscillating transistors 11 and 12 and the resonating circuit 30 constitute a balanced oscillating circuit. Here, the resonating circuit 30 has a configuration in which the first resistor 18 is serially inserted therein.

Here, in the case in which the local oscillating circuit of the invention operates as a local oscillating circuit for receiving low-band signals, when the switching transistor 22 is turned on by applying a high voltage to the base thereof, a bias voltage is not applied to the cathodes of the two protection diodes 19 and 20 and the cathode of the varactor diode 31. As a result, the resonating circuit 30 is coupled to the oscillating transistors 11 and 12 by the large capacitance due to the varactor diode 31. In addition, since the first resistor 18 is connected parallel to the equivalent resistance of the switching transistor 22 when it is turned on, a damping effect of the resonating circuit 30 is reduced. Accordingly, the oscillation condition in a low band is improved. Further, the capacitance between the terminals of the two protection diodes 19 and 20 increases, so that the oscillating frequency is shifted to a low-band side to expand the oscillating frequency band.

Alternatively, in the case in which the local oscillating circuit of the invention operates as a local oscillating circuit for receiving high-band signals, when the switching transistor 22 is turned off by applying a low voltage to the base thereof, a bias voltage is applied to the cathodes of the two protection diodes 19 and 20 and the cathode of the varactor diode 31, respectively. As a result, the resonating circuit 30 is sufficiently coupled to the oscillating transistors 11 and 12 even by the small capacitance due to the varactor diode 31. In addition, since the first resistor 18 is connected parallel to the equivalent resistance of the switching transistor 22 when it is turned off, a damping effect of the resonating circuit 30 increases, thereby preventing abnormal oscillation from occurring in a high frequency. Further, the capacitance between the terminals of the two protection diodes 19 and 20 decreases, so that oscillation up to a high frequency can be realized.

According to the local oscillating circuit of the invention, the integrated circuit is provided with protection diodes against electrostatic damage, cathodes of the protection diodes being respectively connected to terminals to which a resonating circuit is connected and anodes thereof being connected to a ground, and a reverse-biasing voltage is applied to the cathodes of the protection diodes when VHF high-band signals are received while a voltage is not applied to the cathodes when VHF low-band signals are received. Thereby, the capacitance between terminals of the two protection diodes increases when the low-band signals are received, so that the oscillating frequency can be shifted to a low-band side to expand the oscillating frequency band. Also, the capacitance between the terminals of the two protection diodes decreases when the high-band signals are received, so that oscillation up to a high frequency can be realized. As a result, it is possible to receive both high-band and low-band television signals by using a common oscillating transistor and a common resonating circuit.

Further, according to the local oscillating circuit of the invention, one end of the resonating circuit is connected to the first terminal through a coupling varactor diode and the other end thereof is connected to the second terminal, and an anode of the varactor diode is DC connected to a ground and a reverse-biasing voltage is applied to a cathode of the varactor diode when VHF high-band signals are received while a voltage is not applied to the cathode thereof when VHF low-band signals are received. Accordingly, a coupling state between the oscillating transistor and the resonating circuit can be appropriately changed depending on a receiving band, thereby improving an oscillation condition.

Furthermore, according to the local oscillating circuit of the invention, the integrated circuit is further provided with a first resistor whose one end is connected to the second terminal and that is serially inserted in the resonating circuit, a switching transistor whose collector is connected to the other end of the first resistor and emitter is connected to a ground, and a second resistor connected between the collector of the switching transistor and the first terminal. Also, the power supply voltage is applied to the collector of the switching transistor through a power-feeding resistor, and the switching transistor is turned off when the high-band signals are received and is turned on when the low-band signals are received. Thereby, Q of the resonating circuit changes, and as a result, it is possible to prevent abnormal oscillation from occurring and to improve an oscillation condition.

In addition, according to the local oscillating circuit of the invention, the oscillating transistor has first and second transistors, a base of the first oscillating transistor and a collector of the second oscillating transistor are connected to the first terminal through first and second coupling capacitors, respectively, and a collector of the first oscillating transistor and a base of the second oscillating transistor are connected to the other end of the first resistor through third and fourth coupling capacitors, respectively. As such, a balanced oscillating circuit can be constructed.

The invention claimed is:

1. A local oscillating circuit comprising:
   an integrated circuit including an oscillating transistor, protection diodes configured to protect against electrostatic damage, and first and second terminals each being connected to a base and a collector of the oscillating transistor respectively, cathodes of the protection diodes being respectively connected to the first and second terminals, and anodes of the protection diodes being connected to a ground; and
   a resonating circuit that is provided outside the integrated circuit and is connected between the first and second terminals,
   wherein a reverse-biasing voltage is applied to each of the cathodes of the protection diodes when VHF high-band signals are received, while a voltage is not applied to each of the cathodes when VHF low-band signals are received.

2. The local oscillating circuit according to claim 1, wherein one end of the resonating circuit is connected to the first terminal through a coupling varactor diode and another end of the resonating circuit is connected to the second terminal by a capacitor;
   a cathode of the varactor diode connected to the first terminal;
   an anode of the varactor diode DC connected to a ground; wherein
   a reverse-biasing voltage is applied to a cathode of the varactor diode when VHF high-band signals are received, while a voltage is not applied to the cathode thereof when VHF low-band signals are received.

3. The local oscillating circuit according to claim 2, the integrated circuit further includes:
   a first resistor having one end connected to the second terminal and that is serially inserted in the resonating circuit;
   a switching transistor having a collector connected to the other end of the first resistor, and having an emitter connected to a ground; and
   a second resistor connected between the collector of the switching transistor and the first terminal, wherein a power supply voltage is applied to the collector of the switching transistor through a power-feeding resistor, and
   the switching transistor is turned off when the high-band signals are received and is turned on when the low-band signals are received.

4. The local oscillating circuit according to claim 3, wherein the oscillating transistor has first and second oscillating transistors, a base of the first oscillating transistor and a collector of the second oscillating transistor are connected to the first terminal through a first coupling capacitor and a second coupling capacitor, respectively, and
   a collector of the first oscillating transistor and a base of the second oscillating transistor are connected to the other end of the first resistor through a third coupling capacitor and a fourth coupling capacitor, respectively.

* * * * *